United States Patent
Do et al.

(10) Patent No.: US 7,700,458 B2
(45) Date of Patent: Apr. 20, 2010

(54) INTEGRATED CIRCUIT PACKAGE SYSTEM EMPLOYING WAFER LEVEL CHIP SCALE PACKAGING

(75) Inventors: Byung Tai Do, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 426 days.

(21) Appl. No.: 11/462,545

(22) Filed: Aug. 4, 2006

(65) Prior Publication Data
US 2008/0029859 A1    Feb. 7, 2008

(51) Int. Cl.
*H01L 21/301* (2006.01)
*H01L 21/46* (2006.01)
*H01L 21/78* (2006.01)
*H01L 21/44* (2006.01)

(52) U.S. Cl. ............. 438/464; 438/113; 438/114; 438/463; 257/E21.599

(58) Field of Classification Search .......... 438/113, 438/114, 463, 464; 257/E21.599
See application file for complete search history.

(56) References Cited

U.S. PATENT DOCUMENTS

| | | | | |
|---|---|---|---|---|
| 5,987,739 | A | * | 11/1999 | Lake ..................... 29/841 |
| 6,023,094 | A | | 2/2000 | Kao et al. |
| 6,175,162 | B1 | | 1/2001 | Kao et al. |
| 6,603,191 | B2 | * | 8/2003 | Wakabayashi et al. ...... 257/620 |
| 6,806,725 | B2 | * | 10/2004 | Tsui et al. .................. 324/755 |
| 6,916,688 | B1 | | 7/2005 | Kelkar et al. |
| 6,919,262 | B2 | | 7/2005 | Senoo et al. |
| 7,015,064 | B1 | | 3/2006 | Patwardhan et al. |
| 7,169,685 | B2 | * | 1/2007 | Connell et al. ............. 438/460 |
| 2002/0048906 | A1 | * | 4/2002 | Sakai et al. ............... 438/464 |
| 2007/0222207 | A1 | * | 9/2007 | Hendry et al. ............. 283/101 |

* cited by examiner

*Primary Examiner*—Shouxiang Hu
(74) *Attorney, Agent, or Firm*—Mikio Ishimaru (57) ABSTRACT

An integrated circuit package system that includes: providing a substrate with a protective coating; attaching a labeling film to a support member in a separate process; joining the protective coating and the labeling film; and dicing the substrate, the protective coating, and the labeling film to form the integrated circuit package system.

10 Claims, 6 Drawing Sheets

INTEGRATED CIRCUIT PACKAGE SYSTEM EMPLOYING WAFER LEVEL CHIP SCALE PACKAGING

TECHNICAL FIELD

The present invention relates generally to integrated circuits, and more particularly to integrated circuit package systems employing wafer level chip scale packaging.

BACKGROUND ART

Wafer level chip scale packaging (WLCSP) is one of the next generation of packaging solutions that has been developed to meet the demand of miniaturization for electronic devices. WLCSP may include a bumped wafer that can be singulated into individual die that can be directly mounted onto a printed circuit board without any further requirement to package. These individual bumped die may include integrated circuit systems that find application in many of today's consumer electronic devices, such as cell phones, video cameras, portable music players, computers, etc.

Unfortunately, these wafer level chip scale packages can present exposed die problems that arise during subsequent handling. For example, die cracking is becoming a pronounced problem as packaging technology shifts towards a thinner profile (i.e.—with targeted thicknesses of below fifty micrometers). These thinner profile packages lack the structural integrity necessary to withstand subsequent process steps, such as surface mounting and identification marking for device identification purposes.

Thus, a need still remains for a wafer level chip scale integrated circuit package system with enhanced structural integrity that permits non-destructive identification marking of the integrated circuit package system. In view of the ever increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system that includes: providing a substrate with a protective coating; attaching a labeling film to a support member in a separate process; joining the protective coating and the labeling film; and dicing the substrate, the protective coating, and the labeling film to form the integrated circuit package system.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the device are semi-diagrammatic and not to scale and, particularly, some of the dimensions are for the clarity of presentation and are shown exaggerated in the drawing FIGs.

Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Figure 1:
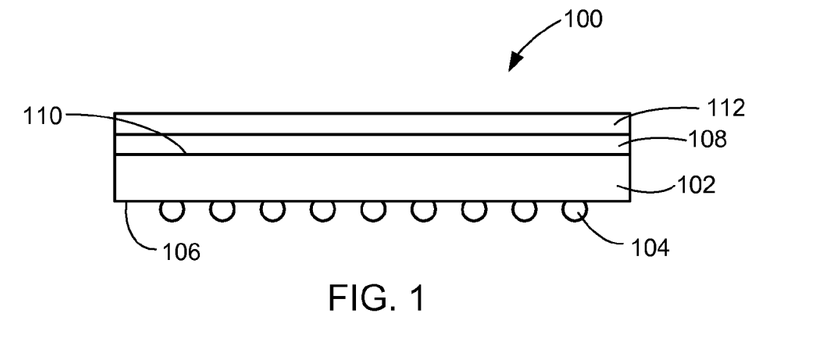
FIG. 1 is a side view of an integrated circuit package system in accordance with an embodiment of the present invention.

Referring now to FIG. 1, therein is shown a side view of an integrated circuit package system 100 in accordance with an embodiment of the present invention. The integrated circuit package system 100 includes a substrate 102, electrical conductors 104, a first surface 106, a protective coating 108, a second surface 110, and a labeling film 112.

The substrate 102 may include a body of material on or in which integrated circuit systems are fabricated. As is well know within the art, the integrated circuit systems may include active components, passive components, and so forth, in numerous configurations and arrangements as may be needed. The body of material chosen for the substrate 102 can be selected from ceramics, silicon, silicon based composites, semiconducting materials other than silicon, plastics, or laminates of various types (organic or inorganic), which are compatible chemically, thermally, and mechanically with the process conditions chosen for the integrated circuit package design.

The electrical conductors 104 are formed on the first surface 106 of the substrate 102. By way of example, the first surface 106 may include the active side or top side of the substrate 102. Generally, the electrical conductors 104 establish an electrical connection between the substrate 102 and external circuitry, such as a printed circuit board or additional package configurations. Although the present embodiment depicts the electrical conductors 104 as solder balls, it is to be understood that the electrical conductors 104 may include any known lead technology, such as pin-in-hole and surface mount.

The protective coating 108 is formed on the second surface 110 of the substrate 102. By way of example, the second surface 110 may include the non-active side or bottom side of the substrate 102. Generally, the protective coating 108 provides a durable and resilient layer that supports and protects the substrate 102. Notably, the application of the protective coating 108 prevents damage to the substrate 102, such as die cracking and warpage, that can occur in subsequent process/handling steps.

The labeling film 112 is formed over the protective coating 108. The labeling film 112 is formed in a separate process. The labeling film 112 can be identification marked and may contain alphanumeric marks and bar codes with information such as the part number, the manufacturer or supplier, and the design specifications, for each of the integrated circuit package system 100. Notably, the separate process employed by the present invention for identification marking the labeling film 112, causes no damage to the protective coating 108 or the substrate 102.

FIGS. 2-11 depict by way of example and not by limitation, an exemplary process flow for the formation of a wafer level integrated circuit package system 200 employing wafer level chip scale packaging, and it is not to be construed as limiting.

Figure 2:
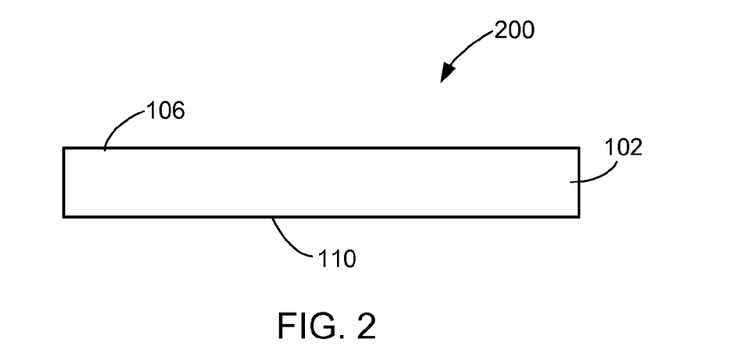
FIG. 2 is a side view of a wafer level integrated circuit package system in an initial stage of manufacture in accordance with an embodiment of the present invention.

Referring now to FIG. 2, therein is shown a side view of the wafer level integrated circuit package system 200 in an initial stage of manufacture in accordance with an embodiment of the present invention. The wafer level integrated circuit package system 200 includes the substrate 102 with the first surface 106 and the second surface 110. As an exemplary illustration, the substrate 102 may include a semiconductor wafer whose dimensions are only limited by current wafer fabrication technology.

Figure 3:
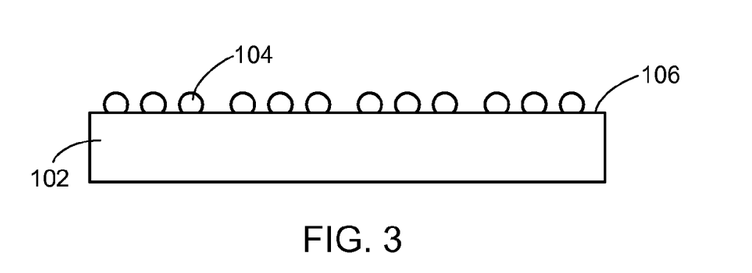
FIG. 3 is the structure of FIG. 2 after the formation of electrical conductors.

Referring now to FIG. 3, therein is shown the structure of FIG. 2 after the formation of the electrical conductors 104. The electrical conductors 104 can be formed on the first surface 106 of the substrate 102.

Figure 4:
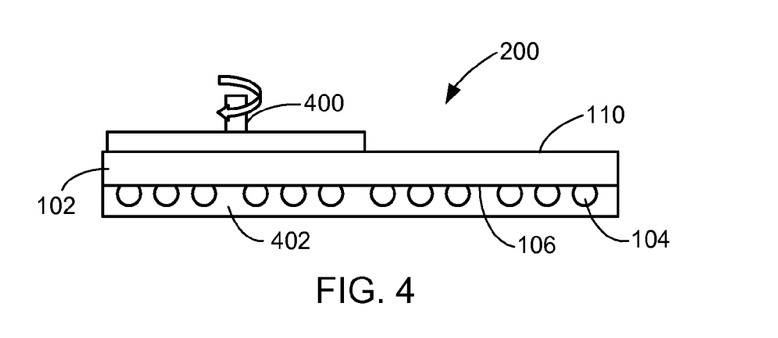
FIG. 4 is the structure of FIG. 3 during etching.

Referring now to FIG. 4, therein is shown the structure of FIG. 3 during etching. By way of example, the second surface 110 of the substrate 102 can be etched or backgrinded by a polisher 400 employing mechanical polishing techniques or chemical mechanical polishing techniques. However, it is to be understood that the present invention is not to be limited to these examples, and the substrate 102 may be etched by other techniques well known within the art. Optionally, the first surface 106 and the electrical conductors 104 can be covered by an etch coating 402, which will protect the first surface 106 and the electrical conductors 104 during etching.

Etching of the second surface 110 of the substrate 102 is commonly done for purposes of promoting adhesion of subsequently deposited layers and/or for purposes of reducing the thickness of the substrate 102. Generally, for thin profile package systems, such as the present invention, the thickness of the substrate 102 is reduced to one-hundred micrometers or less, or more specifically, to fifty micrometers or less.

However, it is to be noted that etching of the substrate 102 is optional, and need not be performed if the substrate 102 already meets the design specifications of the wafer level integrated circuit package system 200.

Figure 5:
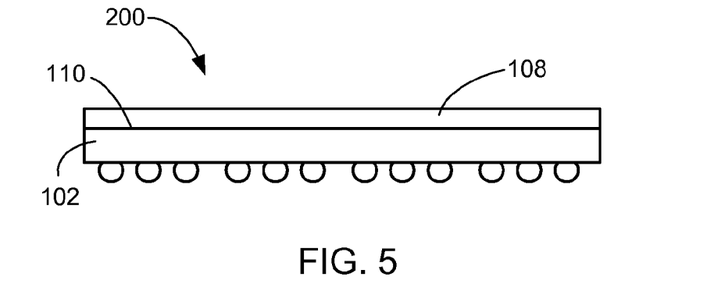
FIG. 5 is the structure of FIG. 4 after the formation of a protective coating.

Referring now to FIG. 5, therein is shown the structure of FIG. 4 after the formation of the protective coating 108. The protective coating 108 is formed on the second surface 110 of the substrate 102. The protective coating 108 can be a liquid or film type of material. If the protective coating 108 is a liquid material it can be applied by various techniques, such as spray coating, roll coating, curtain coating, brush-type coating, and/or spin coating, for example. If the protective coating 108 is a film type of material it can be applied by lamination techniques, for example.

The protective coating 108 should be made from a material that exhibits high adhesion strength, durability, and temperature resistance after being applied to the substrate 102. Generally, high adhesion strength can be defined as the prevention of delamination of the protective coating 108 from the second surface 110 of the substrate 102 during application of a processing stress, such as temperature or force. By way of example, delamination of the protective coating 108 can adversely effect product yield (i.e.—damaged product due to die cracking) and product identification (i.e.—removal of the labeling film 112, of FIG. 1).

Durability of the protective coating 108 is important because it must protect the substrate 102 from damage during subsequent processing and handling. Additionally, durability of the protective coating 108 is important because the more durable the protective coating 108, the more structural support offered to the wafer level integrated circuit package system 200. The greater the structural support offered by the protective coating 108, the less likely the substrate 102 is to warp or crack during subsequent processing steps. Generally, durability of the protective coating 108 can be defined with respect to a material possessing an elastic modulus value sufficient to provide structural support and/or prevent damage to the substrate 102 or the wafer level integrated circuit package system 200.

Temperature resistance of the protective coating 108 is also important because subsequent high temperature processing steps may be employed during surface mount reflow, for example. Generally, the capacity to resist temperature effects can be defined as the ability to resist degradation during high temperature process steps employed during fabrication. If the protective coating 108 is not resistant to high temperatures, such temperatures could cause degradation of the protective coating 108, and subsequent damage to the wafer level integrated circuit package system 200.

Furthermore, by way of example, the protective coating 108 can be optically opaque to protect the substrate 102 from light induced defects.

Figure 6:
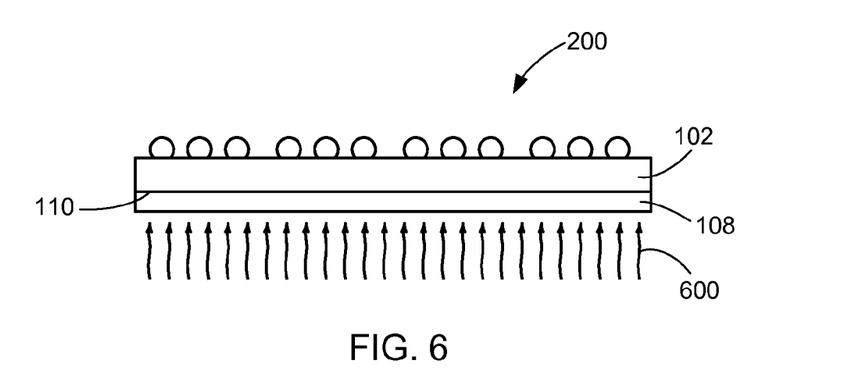
FIG. 6 is the structure of FIG. 5 during curing.

Referring now to FIG. 6, therein is shown the structure of FIG. 5 during curing. This process step is optional and is dependent upon the type of the protective coating 108 deposited. If the protective coating 108 requires a curing process then an energy source 600, such as an electromagnetic energy source, can be applied to the protective coating 108 to induce curing of the material. However, it is to be understood that the curing process is not limited to the above example. The curing process chosen merely depends upon the type of materials selected for the wafer level integrated circuit package system 200. The curing process securely and permanently bonds the protective coating 108 to the second surface 110 of the substrate 102.

Figure 7:
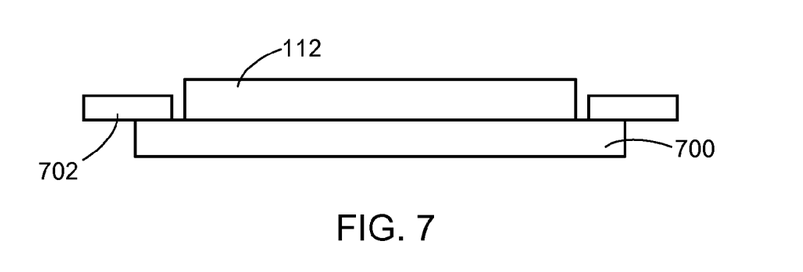
FIG. 7 is the attachment of a labeling film to an adhesive member in accordance with an embodiment of the present invention.
Figure 8:
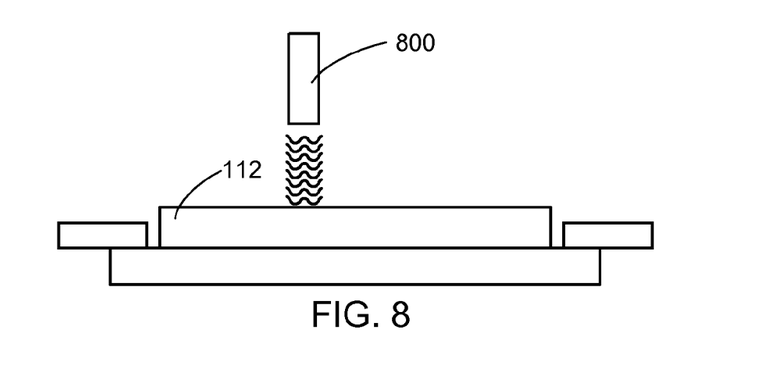
FIG. 8 is the structure of FIG. 7 during marking.

FIGS. 7-8 depict a separate process that can occur before, during, or after the fabrication steps employed in FIGS. 2-6. For purposes of this invention, a separate process refers to a production means operated independently from the fabrication steps employed in FIGS. 2-6.

Referring now to FIG. 7, therein is shown the attachment of the labeling film 112 to an adhesive member 700 in accordance with an embodiment of the present invention. The adhesive member 700, for example, a dicing tape, is attached to a support member 702. By way of example, the support member 702 may include a wafer mount film frame or a hollow wafer mount film frame.

The labeling film 112 should be made from a material that exhibits good bond strength to the protective coating 108, of FIG. 1, high temperature resistance, appropriate adhesion to the adhesive member 700, while allowing various marking techniques. Generally, good bond strength of the labeling film 112 can be defined as the ability to prevent delamination from the protective coating 108 during application of a processing stress, and the capacity to resist temperature effects can be defined as the ability to resist degradation during high temperature process steps employed during fabrication.

Additionally, appropriate adhesion of the labeling film 112 to the adhesive member 700 is important. Examples of the labeling film 112 may include non-ultra-violet curable type films and ultra-violet curable type films. However the labeling film 112 is not to be limited to these examples, the labeling film 112 may include any material that employs an appropriate releasable bond, such as a chemical or thermal releasable bond. Generally, appropriate releasable bond qualities of the labeling film 112 can be defined as the ability to provide support during dicing operations but yet allow "picking" of the integrated circuit package system 100, of FIG. 1, after dicing.

Furthermore, by way of example, the labeling film 112 should allow various marking techniques, such as but not limited to, laser source and ink source.

The support member 702 and the adhesive member 700 can be sized and shaped to receive the labeling film 112 and provide support to the labeling film 112. By way of example, the support member 702 and the adhesive member 700 can be sized and shaped to exactly accommodate the labeling film 112, or the support member 702 and the adhesive member 700 can be sized and shaped slightly larger than the labeling film 112 to eliminate the need of precisely aligning the labeling film 112.

Referring now to FIG. 8, therein is shown the structure of FIG. 7 during marking. A marking source 800 may form a mark, such as an identification mark, on the labeling film 112.

The marking source 800 may include a laser source or an ink source, for example. The marking source 800 may mark the labeling film 112 by a reverse image process to facilitate discernment of the mark.

Figure 9:
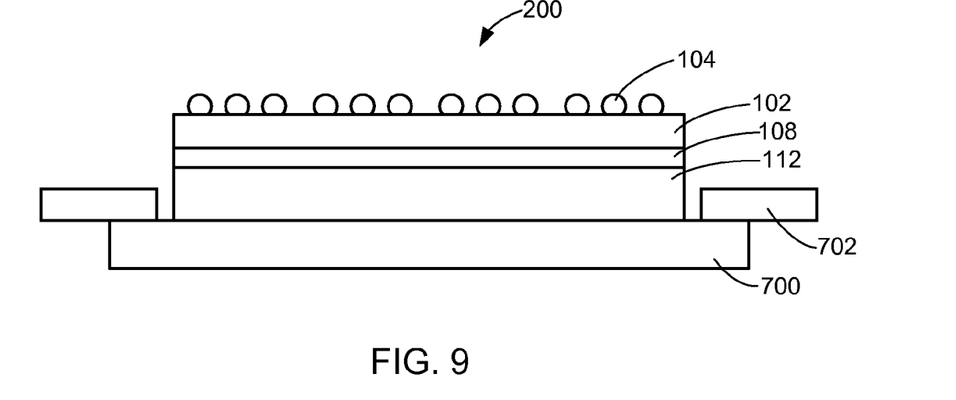
FIG. 9 is the structure of FIG. 8 after attachment to the structure of FIG. 6.

Referring now to FIG. 9, therein is shown the structure of FIG. 8 after attachment to the structure of FIG. 6. The wafer level integrated circuit package system 200 depicts the joining together of the intermediate products from the separate process steps of FIGS. 2-6 and FIGS. 7-8. As can be seen, the intermediate products are joined together by mounting the protective coating 108 onto the labeling film 112. The support member 702 supports the adhesive member 700, which in turn supports the labeling film 112, the protective coating 108, the substrate 102, and the electrical conductors 104.

Figure 10:
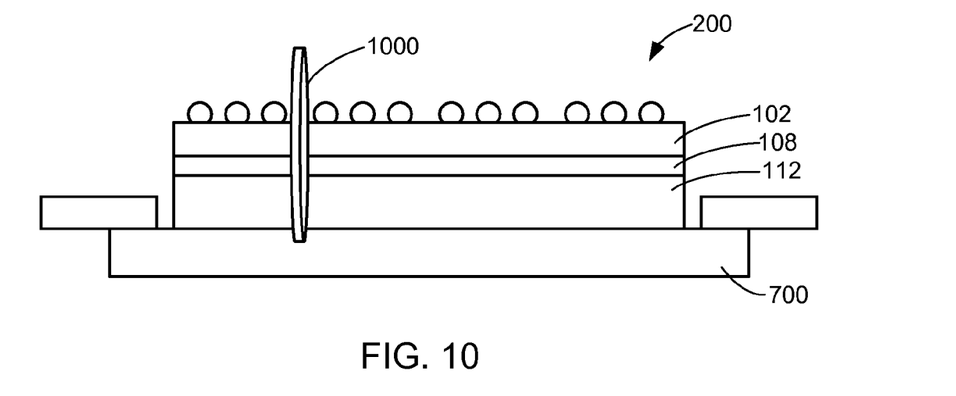
FIG. 10 is the structure of FIG. 9 during dicing.

Referring now to FIG. 10, therein is shown the structure of FIG. 9 during dicing. Per this embodiment, a mechanical saw 1000 is used to cut through the substrate 102, the protective coating 108, the labeling film 112, and partially through the adhesive member 700. However, it is to be understood that the present invention may employ any known die separation process, such as laser dicing, mechanical dicing, or any combination of the two, to singulate the wafer level integrated circuit package system 200.

Figure 11:
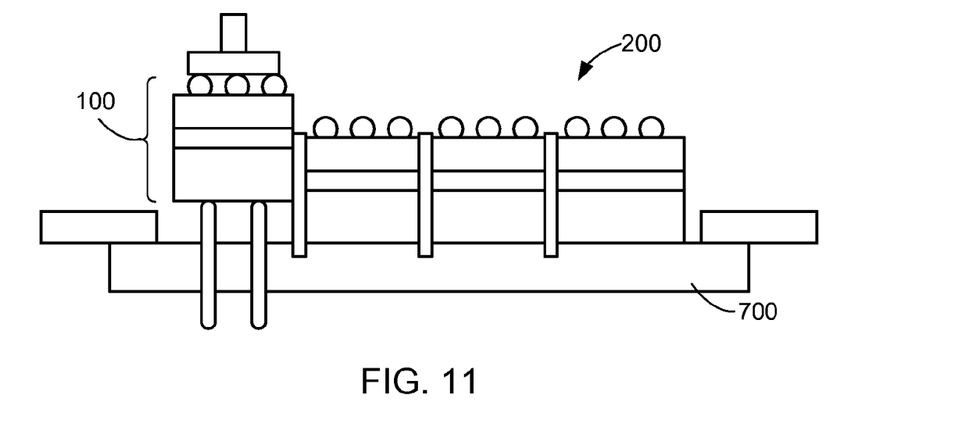
FIG. 11 is the structure of FIG. 10 during picking.

Referring now to FIG. 11, therein is shown the structure of FIG. 10 during picking. After dicing, the wafer level integrated circuit package system 200 includes one or more of the integrated circuit package system 100 that are ready for detachment by being "picked" from the adhesive member 700. However, it is to be understood that other well-known techniques within the art can be employed to remove the integrated circuit package system 100 from the adhesive member 700.

By way of example, the integrated circuit package system 100 can be "picked" from the adhesive member 700 and placed on a leadframe by itself or as part of a multiple component configuration. As exemplary illustrations, the multiple component configuration may include a stacked package, such as a package-in-package configuration and/or a package-on-package configuration.

Additionally, as an exemplary illustration, the present embodiment may also employ a tape and reel packaging process, whereby the integrated circuit package system 100 can be "picked" from the adhesive member 700 and placed on a tape. The tape and reel process and the techniques using it are well known in the art and not repeated herein.

Although the present embodiment only depicts four of the integrated circuit package system 100, it is to be understood that the number of the integrated circuit package system 100 produced by the process steps of FIGS. 2-11, is currently only limited by the technology of semiconductor wafer manufacturing equipment.

Alternative Embodiments

The following alternative embodiments, FIGS. 12-19, depict by way of example and not by limitation, optional methods that can be employed during the fabrication of the integrated circuit package system 100, of FIG. 1, and are not to be construed as limiting. Each of the alternative embodiments can be substituted for the process steps disclosed in FIGS. 7 and 8. As with FIGS. 7-8, each of the alternative embodiments depict a separate process that can occur before, during, or after the fabrication steps employed in FIGS. 2-6.

Alternative Embodiment One

Figure 12:
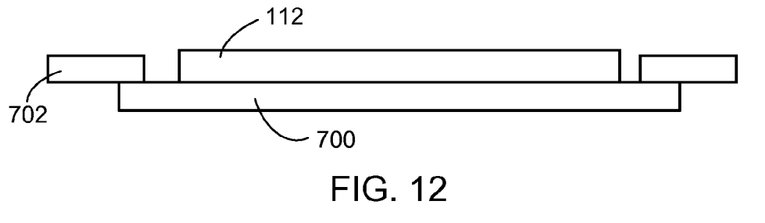
FIG. 12 is the attachment of a labeling film to an adhesive member in accordance with another embodiment of the present invention.

Referring now to FIG. 12, therein is shown the attachment of the labeling film 112 to the adhesive member 700 in accordance with another embodiment of the present invention. The adhesive member 700, for example, a dicing tape, is attached to the support member 702. By way of example, the support member 702 may include a wafer mount film frame or a hollow wafer mount film frame.

Figure 13:
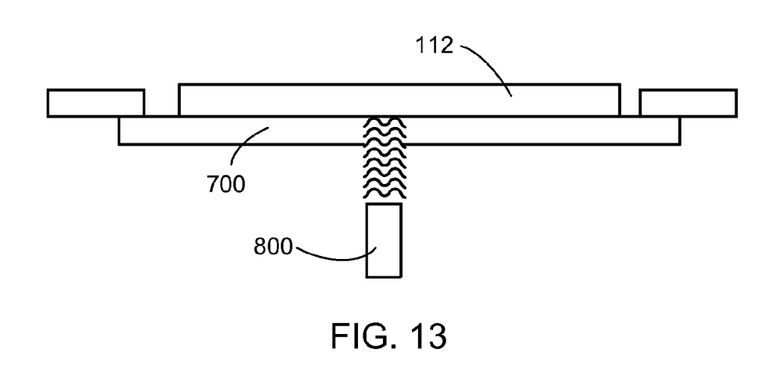
FIG. 13 is the structure of FIG. 12 during marking.

Referring now to FIG. 13, therein is shown the structure of FIG. 12 during marking. The marking source 800 may form a mark, such as an identification mark, on the labeling film 112, through the adhesive member 700. Per this embodiment, the frequency of energy chosen for the marking source 800 is transmissible through the adhesive member 700. Said another way, the adhesive member 700 is transparent to the form of energy chosen by the marking source 800, and allows the energy source to travel through the adhesive member 700 and mark the labeling film 112.

Alternative Embodiment Two

Figure 14:
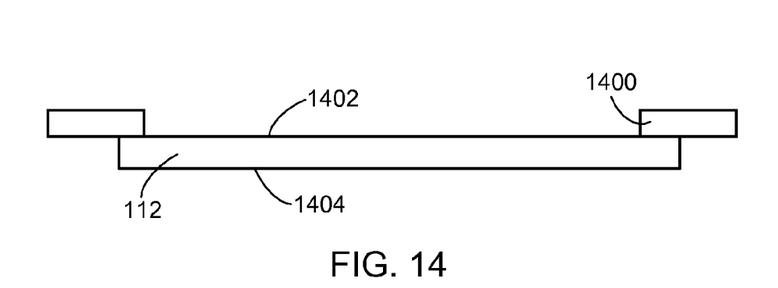
FIG. 14 is the attachment of a labeling film to a sub-mount support member in accordance with another embodiment of the present invention.

Referring now to FIG. 14, therein is shown the attachment of the labeling film 112 to a sub-mount support member 1400 in accordance with another embodiment of the present invention. The labeling film 112 includes a labeling film first surface 1402 and a labeling film second surface 1404. Per this embodiment, the labeling film first surface 1402 is directly attached to the sub-mount support member 1400. By way of example, the sub-mount support member 1400 may include a hollow wafer mount film frame.

Figure 15:
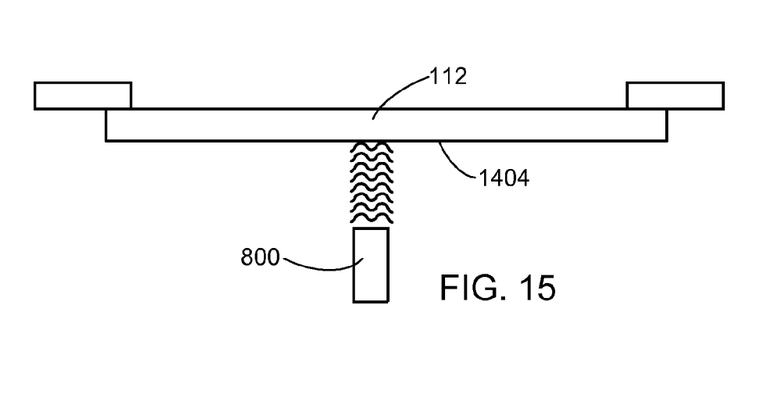
FIG. 15 is the structure of FIG. 14 during marking.

Referring now to FIG. 15, therein is shown the structure of FIG. 14 during marking. The marking source 800 may form a mark, such as an identification mark, directly on the labeling film 112. The marking source 800 is located on the same side as the labeling film second surface 1404.

Figure 16:
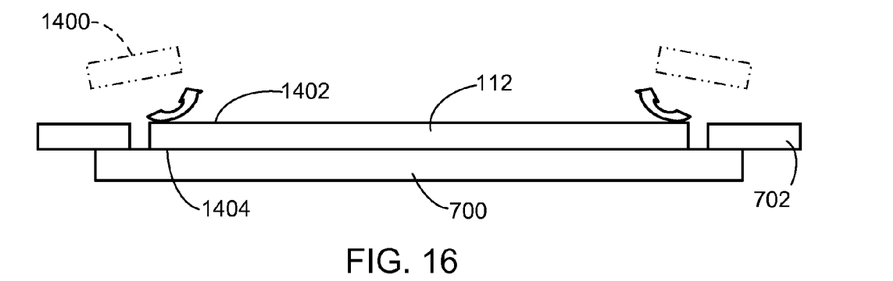
FIG. 16 is the structure of FIG. 15 during mounting of a labeling film to an adhesive member.

Referring now to FIG. 16, therein is shown the structure of FIG. 15 during mounting of the labeling film 112 to the adhesive member 700. Per this embodiment the labeling film second surface 1404 is attached to the adhesive member 700, and the sub-mount support member 1400 (shown in phantom outline) is removed from the labeling film first surface 1402. The adhesive member 700 is attached to the support member 702.

Alternative Embodiment Three

Figure 17:
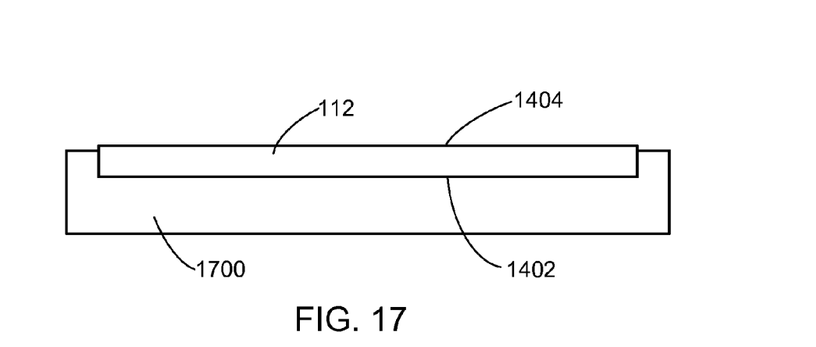
FIG. 17 is a labeling film attached to a platform in accordance with another embodiment of the present invention.

Referring now to FIG. 17, therein is shown the labeling film 112 attached to a platform 1700 in accordance with another embodiment of the present invention. The platform 1700 may include a loading jig, for example. The platform 1700 may be slightly larger than the labeling film 112, or the platform 1700 may have the same outline dimensions of the substrate 102, of FIG. 2. Per this embodiment, the labeling film first surface 1402 is adhered to the platform 1700 and the labeling film second surface 1404 is left exposed.

Figure 18:
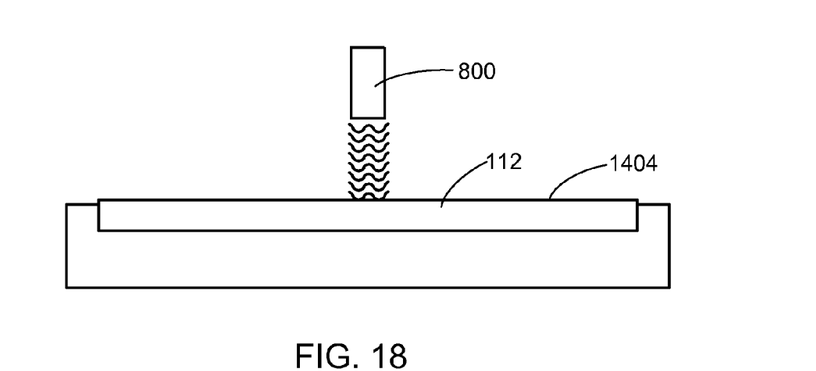
FIG. 18 is the structure of FIG. 17 during marking.

Referring now to FIG. 18, therein is shown the structure of FIG. 17 during marking. The marking source 800 may form a mark, such as an identification mark, on the labeling film 112 by a reverse image process. The marking source 800 is located on the same side as the labeling film second surface 1404.

Figure 19:
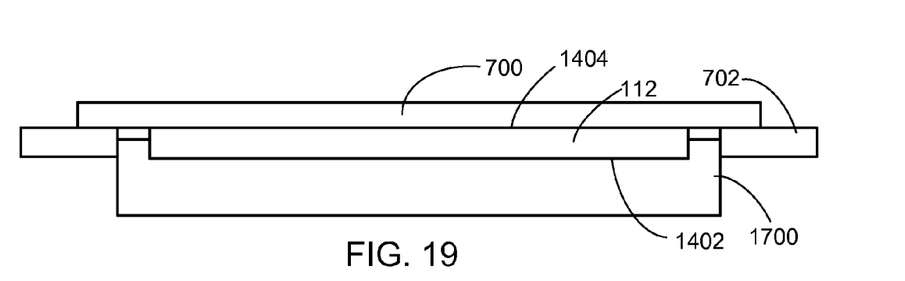
FIG. 19 is the structure of FIG. 18 during mounting of a labeling film to an adhesive member.

Referring now to FIG. 19, therein is shown the structure of FIG. 18 during mounting of the labeling film 112 to the adhesive member 700. Per this embodiment the labeling film second surface 1404 is attached to the adhesive member 700, and the platform 1700 is eventually removed from the labeling film first surface 1402. The adhesive member 700 is attached to the support member 702.

Figure 20:
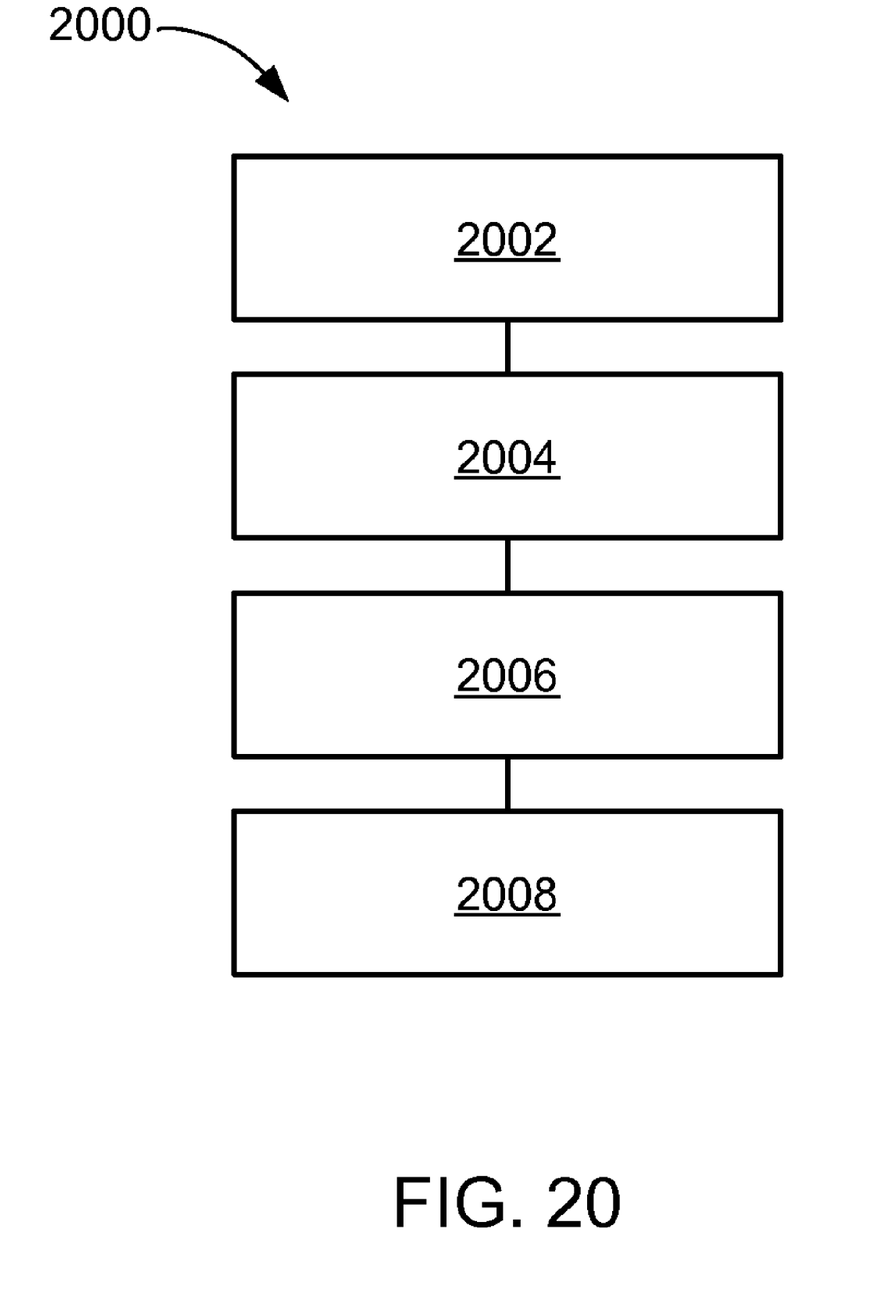
FIG. 20 is a flow chart of an integrated circuit package system for an integrated circuit package system in accordance with an embodiment of the present invention.

Referring now to FIG. 20, therein is shown a flow chart of an integrated circuit package system 2000 for the integrated circuit package system 100 in accordance with an embodiment of the present invention. The integrated circuit package system 2000 includes providing a substrate with a protective coating in a block 2002; attaching a labeling film to a support member in a separate process in a block 2004; joining the protective coating and the labeling film in a block 2006; and dicing the substrate, the protective coating, and the labeling film to form the integrated circuit package system in a block 2008.

It has been discovered that the present invention thus has numerous aspects. A principle aspect is that the present invention employs a separate protective coating material and a separate labeling film material. The development and production of separate protective coating and labeling film materials can lead to a cost-savings for the manufacturer.

Another aspect is that the present invention does not mark the protective coating layer. Since the present invention employs a separate marking process on a separate labeling film, the deposition of the protective coating may occur with less stringent control standards because the deposition uniformity of the protective coating will no longer affect marking quality. This relaxation in deposition uniformity control standards will reduce manufacturing costs.

Another aspect of the present invention is that the separate marking process of the labeling film will prevent any damage to the electrical devices formed on or within the integrated circuit package system. Most notably, electrical devices that are sensitive to electromagnetic energy will no longer be subject to the damaging effects of laser marking. By increasing the number of good devices formed per unit production, the cost of manufacturing can be reduced.

Another aspect of the present invention is that the separate marking and labeling film process eliminates the need for additional handling of the integrated circuit package system. By reducing the number of handling steps, the incidence of possible manufacturing problems, such as wafer breakage, are reduced.

Yet still, another aspect of the present invention is that the separate labeling process allows re-working of the labeling film if there is an error during identification marking. By reducing the potential of scrapping a completed device due to an error in identification marking, a cost savings is realized by the manufacturer.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for employing a separate labeling film process. The resulting processes and configurations are straightforward, cost-effective, uncomplicated, highly versatile and effective, can be implemented by adapting known technologies, and are thus readily suited for efficiently and economically manufacturing integrated circuit package systems.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   providing a substrate with a protective coating;
   attaching a labeling film to a support member in a separate process;
   joining the substrate with the protective coating and the labeling film after the step of attaching; and
   dicing the substrate, the protective coating, and the labeling film to form the integrated circuit package system.

2. The method as claimed in claim 1 wherein:
   providing the substrate with the protective coating includes forming the protective coating from a liquid or film type of material.

3. The method as claimed in claim 1 further comprising:
   configuring the protective coating to prevent delamination, to provide structural support, and to resist temperature effects.

4. The method as claimed in claim 1 further comprising:
   marking the labeling film with a marking source.

5. The method as claimed in claim 1 further comprising:
   configuring the labeling film to prevent delamination, to resist temperature effects, and to exhibit appropriate releasable bond qualities.

6. A method of manufacture of an integrated circuit package system comprising:
   providing a substrate with a first surface and a second surface;
   forming electrical conductors on the first surface of the substrate;
   forming a protective coating on the second surface of the substrate;
   attaching a labeling film to a support member in a separate process;
   mounting the substrate with the protective coating onto the labeling film, after the step of attaching, to form a wafer level integrated circuit package system; and
   dicing the wafer level integrated circuit package system to form the integrated circuit package system.

7. The method as claimed in claim 6 wherein:
   attaching the labeling film to the support member includes attaching the labeling film to an adhesive member and marking the labeling film by a reverse image process.

8. The method as claimed in claim 6 wherein:
   attaching the labeling film to the support member includes attaching the labeling film to an adhesive member and marking the labeling film though the adhesive member.

9. The method as claimed in claim 6 wherein:
   attaching the labeling film to the support member includes attaching the labeling film to a sub-mount support member and directly marking the labeling film.

10. The method as claimed in claim 6 wherein:
    attaching the labeling film to the support member includes attaching the labeling film to a platform and marking the labeling film by a reverse image process.

* * * * *

UNITED STATES PATENT AND TRADEMARK OFFICE
CERTIFICATE OF CORRECTION

PATENT NO. : 7,700,458 B2  Page 1 of 1
APPLICATION NO. : 11/462545
DATED : April 20, 2010
INVENTOR(S) : Do et al.

It is certified that error appears in the above-identified patent and that said Letters Patent is hereby corrected as shown below:

Column 10, claim 8, line 19, delete "though" and insert therefor --through--

Signed and Sealed this

Twenty-ninth Day of June, 2010

David J. Kappos
*Director of the United States Patent and Trademark Office*